United States Patent
Han et al.

(10) Patent No.: US 7,154,790 B2
(45) Date of Patent: Dec. 26, 2006

(54) MULTI-CHIP SEMICONDUCTOR PACKAGES AND METHODS OF OPERATING THE SAME

(75) Inventors: Sang-Jib Han, Gyeonggi-do (KR); Chang-Hwan Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 103 days.

(21) Appl. No.: 11/001,343

(22) Filed: Dec. 1, 2004

(65) Prior Publication Data
US 2006/0056248 A1    Mar. 16, 2006

(30) Foreign Application Priority Data
Sep. 13, 2004   (KR)   ........... 10-2004-0073069

(51) Int. Cl.
*G11C 5/14* (2006.01)
(52) U.S. Cl. ............... 365/189.09; 365/201; 365/226
(58) Field of Classification Search ........ 365/189.09, 365/201, 226
See application file for complete search history.

(56) References Cited

U.S. PATENT DOCUMENTS 5,677,885 A * 10/1997 Roohparvar ............ 365/201
6,898,130 B1 * 5/2005 Kajigaya et al. ........ 365/189.02
2004/0037150 A1 * 2/2004 Park et al. .............. 365/226
2004/0061516 A1   4/2004 Murata

FOREIGN PATENT DOCUMENTS

| JP | 09-198899 | 7/1997 |
|---|---|---|
| KR | 2001-0039826 | 5/2001 |
| KR | 2004-0040327 | 5/2004 |

* cited by examiner

*Primary Examiner*—Aule Phung
*Assistant Examiner*—N Nguyen
(74) *Attorney, Agent, or Firm*—Myers Bigel Sibley & Sajovec (57) ABSTRACT

Integrated circuit devices are provided including first and second chips and a common input/output pad electrically coupled to the first and second chips. At least one of the first and second chips includes a high voltage generator configured to receive an input voltage through the common input/output pad and generate a test voltage responsive to a test mode signal during a test mode of operation. The test voltage is higher than the input voltage. Related methods of operating integrated circuit devices and semiconductor devices are also provided.

30 Claims, 3 Drawing Sheets

MULTI-CHIP SEMICONDUCTOR PACKAGES AND METHODS OF OPERATING THE SAME

CLAIM OF PRIORITY

This application is related to and claims priority from patent application Ser. No. 2004-73069, filed on Sep. 13, 2004, the disclosure of which is hereby incorporated herein by reference as if set forth in its entirety.

FIELD OF THE INVENTION

The present invention relates to semiconductor devices and methods of operating the same and, more particularly, to semiconductor devices included in multi-chip packages and methods of operating the same.

BACKGROUND OF THE INVENTION

Semiconductor design and manufacture has many goals, including designing high performance, highly integrated, lower cost, miniaturized products. At the present time, semiconductor devices are mass produced at about 18 μm or less and this process involves well known levels of integration. To further reduce the overall size and the cost of semiconductor devices, two or more chips may be packaged together for use in computers and other devices. For example, multi-chip packaging may be used to integrate chips, such as processors and memory chips, or logic chips and memory chips including, for example, DRAMs, flash memories, and the like, in a single package. Thus, the cost and the overall size of these semiconductor devices/chips may be reduced.

Furthermore, memory chips (dies or devices) that are typically offered in single packages may be combined into multi-chip packages, which may increase overall memory capacity of the memory chips. In these multi-chip packages, memory chips contained in the package may be configured to share external pins, such as address pins, control pins, data pins and the like. When different types of chips are combined into a single package, testing the chips may be difficult.

SUMMARY OF THE INVENTION

Some embodiments of the present invention provide integrated circuit devices including first and second chips and a common input/output pad electrically coupled to the first and second chips. At least one of the first and second chips includes a high voltage generator configured to receive an input voltage through the common input/output pad and generate a test voltage responsive to a test mode signal during a test mode of operation. The test voltage is higher than the input voltage.

In further embodiments of the present invention, the at least one of the first and second chips may include an internal circuit and the high voltage generator may be further configured to provide the generated test voltage to the internal circuit. The at least one of the first and second chips may further include a voltage generator, which may be configured to provide a normal voltage to the internal circuit during a normal mode of operation.

In still further embodiments of the present invention, the at least one of the first and second chips may further include first and second switching circuits. The first switching circuit may be electrically coupled to the high-voltage generator and configured to provide the test voltage to the internal circuit responsive to the test mode signal during the test mode of operation. The second switching circuit may be electrically coupled to the voltage generator and configured to provide the normal voltage to the internal circuit responsive to the test mode signal during the normal mode of operation. In certain embodiments of the present invention the first and second switching circuits may be NMOS and/or PMOS transistors.

In some embodiments of the present invention, the first chip may include a flash memory device and the second chip may include a chip designed for low voltage operation. The at least one of the first and second chips may include the flash memory device and the high-voltage generator may be configured to generate the test voltage such that the chip designed for low voltage operation is shielded from the test voltage. The test voltage may be a voltage from about 4.5 V to about 6 V.

Further embodiments of the present invention provide semiconductor memory devices including a high-voltage generator configured to receive an input voltage and to generate a test voltage responsive to a test mode control signal during a test mode of operation such that a low voltage device coupled to the semiconductor memory device is shielded from the test voltage. The test voltage is higher than the input voltage.

In still further embodiments of the present invention, the semiconductor memory device may include an input/output pad electrically coupled to the high-voltage generator and the low voltage device. The input/output pad may be configured to provide the input voltage to the high-voltage generator. An internal circuit may be electrically coupled to the high-voltage generator. The high-voltage generator may be further configured to provide the test voltage to the internal circuit responsive to the test mode signal during a test mode of operation.

In some embodiments of the present invention, the semiconductor device may further include a voltage generator that may be electrically coupled to the internal circuit. The voltage generator may be configured to provide a normal voltage to the internal circuit responsive to the test mode signal during a normal mode of operation. The semiconductor device may further include first and second switching circuits. The first switching circuit may be electrically coupled to the high-voltage generator and configured to provide the test voltage to the internal circuit responsive to the test mode signal during a test mode of operation. The second switching circuit may be electrically coupled to the voltage generator and configured to provide the normal voltage to the internal circuit responsive to the test mode signal during a normal mode of operation.

Further embodiments of the present invention provide a semiconductor memory device including a first input/output pad configured to receive a voltage signal and a controller configured to generate a test mode signal indicating operation in a normal mode of operation of a test mode of operation. A high voltage generator, electrically coupled to the controller and configured to generate a test voltage, higher than the voltage signal, responsive to the voltage signal and the test mode signal is also included. A voltage generator is provided that is configured to generate a normal voltage, less than the test voltage. A word line driver, electrically coupled to the high-voltage generator and the voltage generator, is configured to drive a word line responsive the normal voltage or the test voltage responsive to the test mode signal.

In still further embodiments of the present invention, the semiconductor memory device may be a flash memory device. The test voltage may include a voltage from about 4.5 V to about 6.0 V.

Some embodiments of the present invention provide first and second semiconductor chips a common input/output pad electrically coupled to the first and second semiconductor chips. The first semiconductor chip includes a controller configured to generate a test mode signal indicating operation in a normal mode of operation or a test mode of operation. A high voltage generator is electrically coupled to the controller and the input/output pad and is configured to receive a voltage signal from the common input/output pad and generate a test voltage, higher than the voltage signal, during the test mode of operation responsive to the voltage signal and the test mode signal. A normal voltage generator is provided and is configured to generate a normal voltage, less than the test voltage during the normal mode of operation. A word line supply circuit is electrically coupled to the high-voltage generator and the voltage generator and is configured to drive the word line responsive to the normal voltage or test voltage responsive to the test mode signal.

In further embodiments of the present invention, the word line supply circuit may include a word line driver and first and second switching circuits. The word line driver may be electrically coupled to the high-voltage generator and the voltage generator and may be configured to drive the word line responsive to the normal voltage or the test voltage. The first switch may be electrically coupled to the high-voltage generator and is configured to transmit the test voltage to the word line driver responsive to the test mode signal in the test mode of operation. A second switch may be electrically coupled to the voltage generator configured to transmit the normal voltage to the word line driver responsive to the test mode signal during the normal mode of operation. In still further embodiments of the present invention, the first semiconductor chip may be a flash memory chip.

While the present invention is described above primarily with reference to semiconductor devices, methods of operating semiconductor devices are also provided herein.

DETAILED DESCRIPTION OF EMBODIMENTS OF THE PRESENT INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Semiconductor devices, such as flash memory devices, may be damaged during a fabrication process. For example, one or more cells of the flash memory device may be under programmed. A repeated program/erase operation of these under-programmed cells, may cause a threshold voltage profile in one or more regions to be lower than a reference voltage, for example, 4.5V. This threshold voltage is used as the point at which the memory cell turns on and/or off. Thus, if the threshold voltage is not accurate, the cell may be turned on when it is supposed to be off or visa versa.

A test operation with respect to the threshold voltage profile may be performed on the flash memory device at a wafer level to determine if one or more cells are under programmed. Flash memory devices according to some embodiments of the present invention may be included in multi-chip packages, and the test operation with respect to the threshold voltage profile may be performed again once the memory device is packaged.

During a test mode, a high voltage relative to the power voltage (4.5 V), such as 6V, may be applied to a word line of the flash memory device through an input/output pad or an external pin. If this pin or input/output pad is shared with another chip, which is designed for a low-voltage operation, the chip designed for low-voltage operation may be damaged during testing. For example, a gate oxide layer of the chip designed for low-voltage operation may be damaged due to the application of the high voltage on the shared pin.

Figure 1:
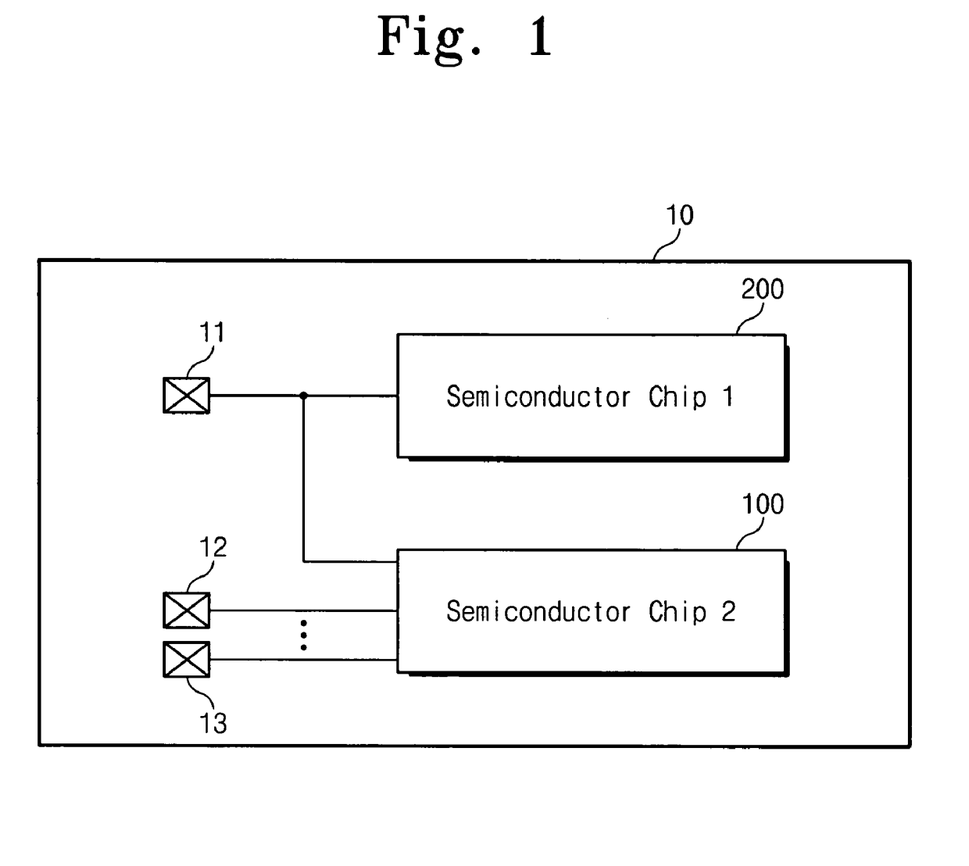
FIG. 1 is a schematic block diagram illustrating multi-chip packages according to some embodiments of the present invention.
Figure 2:
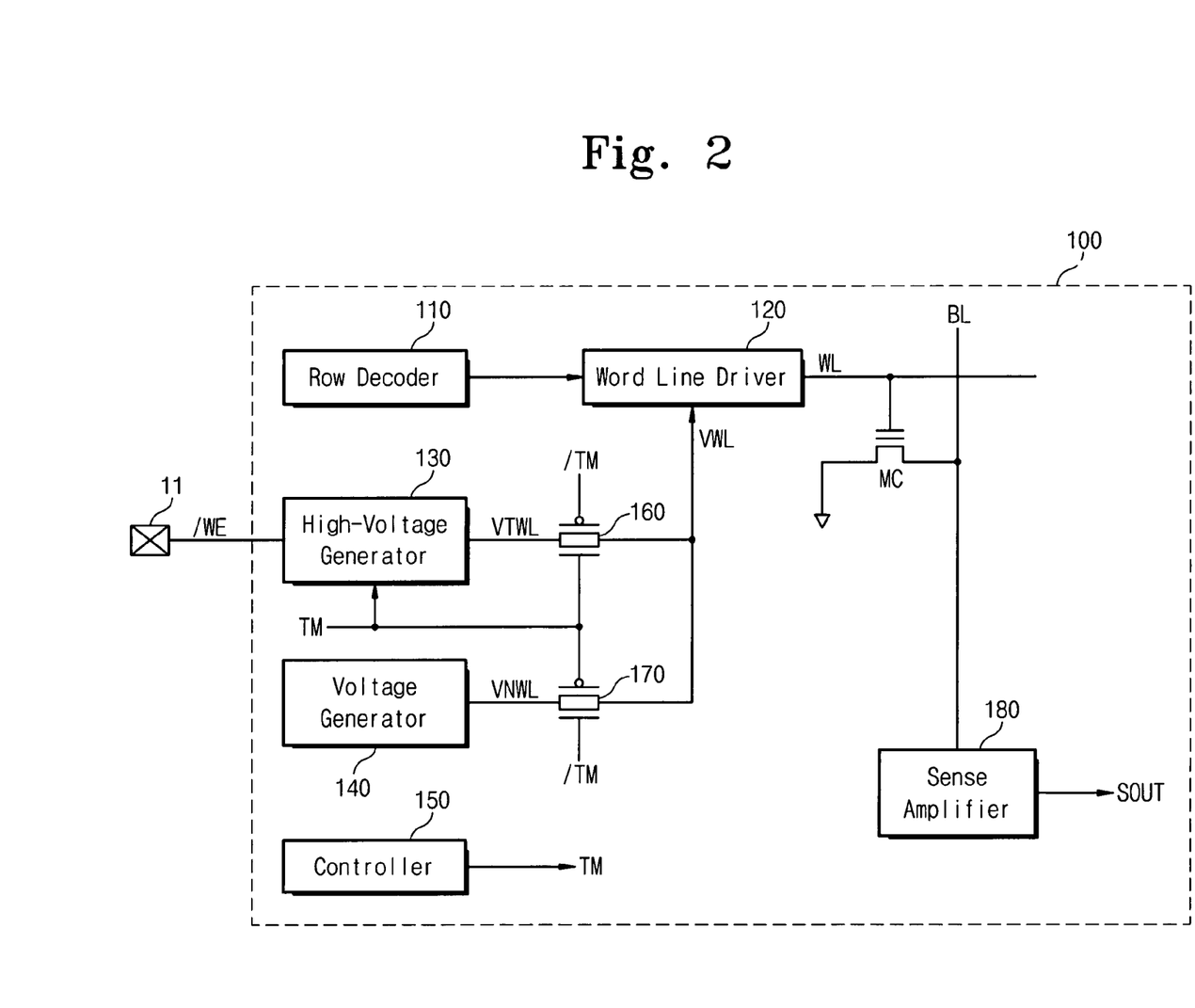
FIG. 2 is a schematic block diagram illustrating semiconductor chips included in the multi-chip packages according to further embodiments of the present invention.
Figure 3:
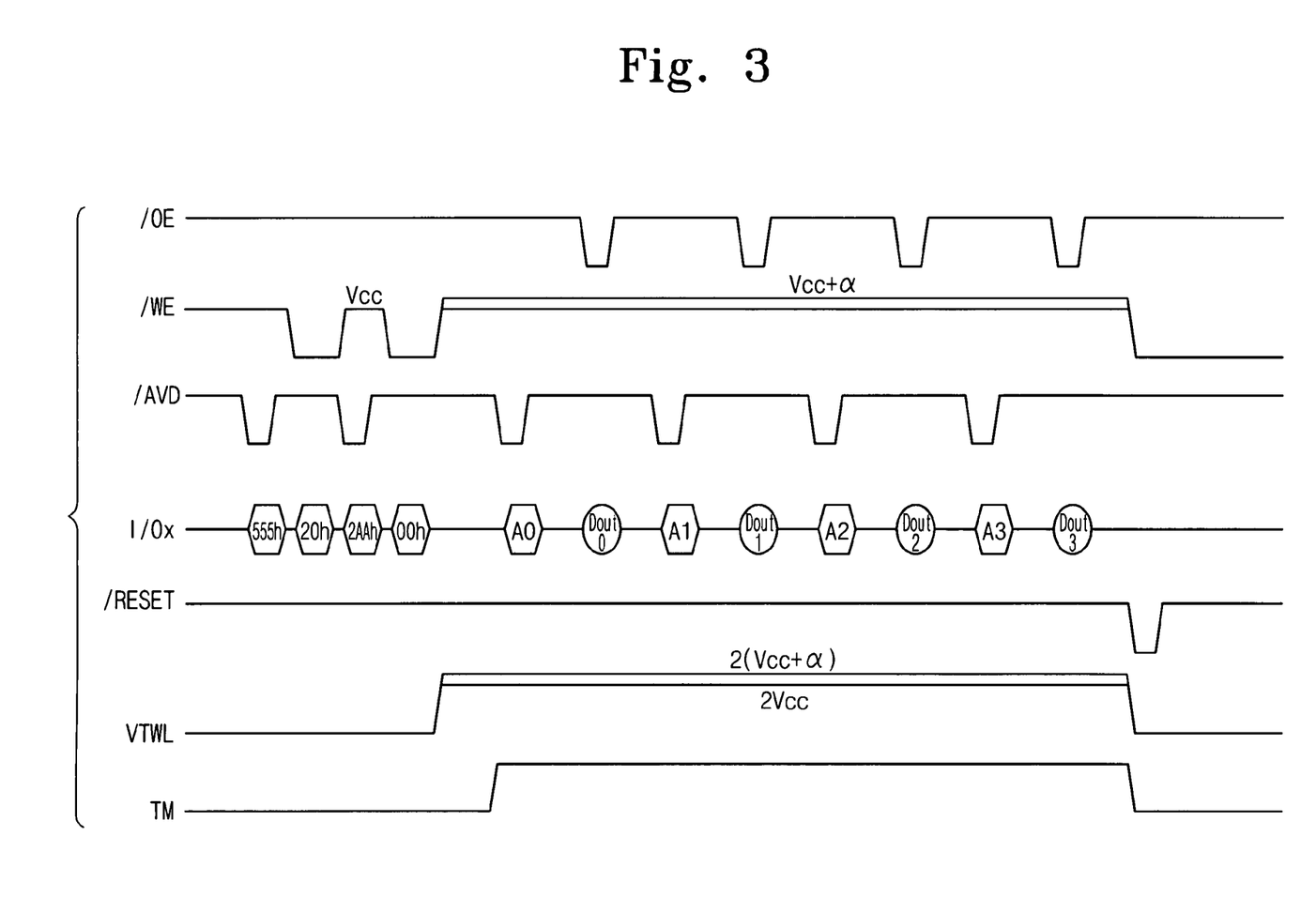
FIG. 3 is a timing diagram illustrating operation of semiconductor devices according to some embodiments of the present invention in a test mode of operation.

As discussed herein with respect to FIGS. 1 through 3, according to some embodiments of the present invention, semiconductor devices may include a high-voltage generator that receives an input voltage having a normal voltage from the common input/output pad and generates a test voltage of from about 4.5 V to 6 V such that the semiconductor chip designed for low voltage operation is shielded from the high voltage during a test mode of operation. In other words, a normal voltage, i.e. a voltage that may not damage the semiconductor device designed for low voltage operation, may be applied to the common input/output pad and then a circuit internal to the memory device may boost the normal voltage to a high voltage. Thus, the semiconductor device designed for low voltage operation may not see the high voltage as discussed further herein.

Referring now to FIG. 1, a schematic block diagram of multi-chip packages according to some embodiments of the present invention will be discussed. As illustrated in FIG. 1, a multi-chip package 10 includes at least two semiconductor chips 100 and 200. The first semiconductor chip 100 may be, for example, a memory device, such as a flash memory device and the second semiconductor chip 200 may be, for example, a device designed for low-voltage operation. It will be understood that although multi-chip packages discussed herein include two chips, embodiments of the present invention are not limited to this configuration. For example, more than two semiconductor chips may be included in a single package without departing from the scope of the present invention.

As further illustrated in FIG. 1, the first and second semiconductor chips 100 and 200 are electrically coupled to first through third input/output pads 11, 12, and 13 so as to allow the first and second semiconductor devices 100 and 200 to communicate with devices external to the multi-chip package 10. The first input/output pad 11 may be a common input/output pad that is shared between the first and second semiconductor chips 100 and 200. As illustrated, the second and third pads 12 and 13 are provided for the second semiconductor chip 200.

It will be understood that although the first and second semiconductor chips 100 and 200 share a single pad 11 in FIG. 1, embodiments of the present invention are not limited to this configuration. For example, the first and second semiconductor chips may share two or more input/output pads without departing from the scope of the present invention. Similarly, although embodiments of the present invention illustrated in FIG. 1 the first semiconductor device 100 having no unshared input/output pads and the second semiconductor device 200 having two unshared input/output pads, embodiments of the present invention are not limited to this configuration. For example, the first semiconductor device 100 may have one or more unshared input/output pads and the second semiconductor device 200 may have less than two or three or more unshared pads without departing from the scope of the present invention.

Referring now to FIG. 2, a block diagram illustrating the semiconductor chip 100, such as a flash memory device, according to some embodiments of the present invention will be discussed. It will be understood that the elements included in the first semiconductor chip 100 in FIG. 2 are provided for exemplary purposes to illustrate some embodiments of the present invention and, therefore, other elements may be included in the first semiconductor chip 100 without departing from the scope of the present invention. In particular, FIG. 2 illustrates elements used to test a threshold voltage profile of a memory cell MC by applying a high voltage to a word line.

As illustrated in FIG. 2, a flash memory device 100 includes a memory cell MC, a row decoder 110, a word line supply circuit including a word line driver 120 and first and second switching circuits 160 and 170, a high-voltage generator 130, a voltage generator 140, a controller 150, and a sense amplifier 180. The memory cell MC is electrically coupled to a word line WL and a bit line BL.

The row decoder 10 is configured to decode a row address input using input/output pads (not shown) coupled to an external circuit or device. The word line driver 120 is configured to drive the word line WL corresponding to the row address to a word line driving voltage VWL. The sense amplifier 180 is configured to sense and/or amplify data that is stored in the memory cell MC using the bit line BL.

The controller 150 is configured to output a test mode signal TM responsive to a command input using input/output pads (not shown) coupled to an external device or circuit. In some embodiments of the present invention, the test mode signal TM is at a logic high level during a test mode of operation and is at a logic low level during a normal mode of operation. In some embodiments of the present invention, the test mode of operation and the normal mode of operation are mutually exclusive modes of operation. As illustrated in FIG. 2, the test mode signal TM may be supplied to the high-voltage generator 130 and the first and second switching circuits 160 and 170.

The high-voltage generator 130 is configured to generate a test word line driving voltage VTWL (test voltage) having a higher voltage than a power voltage responsive to a normal voltage signal/WE that is applied to the input/output pad 11. The test voltage VTWL may be from about 4.5V to about 6V and may be a voltage level suitable for detecting whether the memory cell MC is programmed normally or not. The high-voltage generator 130 may be configured to vary a level of the test voltage VTWL according to a variation of the normal voltage signal/WE that is applied to the input/output pad 11. As a result, a voltage for driving the word line may be changed so that it may be possible to detect the threshold voltage profile of the memory cell MC.

The voltage generator 140 is configured to generate various voltages used for an operation of the flash memory device 100 during a normal mode of operation. The normal voltage VNWL generated by the voltage generator 140 may be provided to the word line driver 120 as a word line driving voltage VWL through the second switching circuit 170.

According to some embodiments of the present invention, the first and second switching circuits 160 and 170 may be transmission gates, such as an NMOS transistor and a PMOS transistor, respectively. For example, when the test mode signal TM is at a logic high level (during a test mode of operation), the test voltage VTWL from the high-voltage generator 130 is provided to the word line driver 120 as the word line driving voltage VWL through the switch 160. Furthermore, when the test mode signal TM is at a logic low level during a normal mode of operation, the normal voltage VNWL from the voltage generator 140 is provided to the word line driver 120 as the driving voltage VWL through the switch 170.

It will be understood that although some embodiments of the present invention discussed herein include transmission gates as the first and second switching circuits 160 and 170, embodiments of the present invention are not limited to this configuration. Any circuits or combination of circuits capable of switching between outputs of the high voltage generator 130 and the voltage generator 140 can be used without departing from the scope of the present invention.

Applying a normal voltage, such as 4.5 V, to the common input/output pad and generating the higher voltage, such as between about 4.5 V and 6 V, at the first semiconductor device 100 may shield the second semiconductor device 200 (FIG. 1) from the higher voltage. Thus, if the second semiconductor device 200 is a device designed for low voltage operation, shielding the second semiconductor device from the high voltage may reduce the likelihood that the second semiconductor device 200 will be damaged by the high voltage.

Referring now to FIG. 3, a timing diagram illustrating operations of the first semiconductor device during a test mode of operation according to some embodiments of the present invention will be discussed. As illustrated on input/output line I/Ox, commands 20h and 00h are input through input/output pads. Responsive thereto, the controller 150 is configured to transition the test mode signal TM to a logic high level. The high-voltage generator 130 increases the normal voltage signal/WE, such as 4.5 V, input through the common input/output pad 11 to generate the test voltage VTWL of from about 4.5 V to about 6V when the test mode signal TM is at a logic high level during a test mode of operation. The row decoder 110 is configured to sequentially decode a series of addresses A0, A1, A2, and A3 as illustrated on the input/output line I/Ox. Furthermore, the row decoder 110 is further configured to drive the word line WL to the test voltage VTWL input through the first switching circuit 160 when the word line WL is selected. The sense amplifier 180 senses and/or amplifies data stored in the memory cell MC. Accordingly, data Dout 0, Dout 1, Dout 2, and Dout 3 are sequentially output as illustrated on the input/output line I/Ox. By varying the normal mode signal input using the common input/output pad 11, it may be possible to measure a threshold voltage profile with respect to a given address.

After a normal voltage having a power voltage level is input using the common input/output pad 11 instead of a high voltage required in a test mode, the normal voltage of the power voltage level is increased in the flash memory 100 by the high-voltage generator 130. Therefore, it may be possible to reduce the likelihood that another chip 200 contained in the multi-chip package 10 will be damaged by the high voltage.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit device comprising:
first and second chips; and
a common input/output pad electrically coupled to the first and second chips, at least one of the first and second chips comprising:
a high voltage generator configured to receive an input voltage through the common input/output pad and generate a test voltage, higher than the input voltage, responsive to a test mode signal during a test mode of operation.

2. The device of claim 1, wherein the at least one of the first and second chips comprising the high voltage generator further comprises an internal circuit and wherein the high voltage generator is further configured to provide the generated test voltage to the internal circuit.

3. The device of claim 2, wherein the at least one of the first and second chips further comprises a voltage generator configured to provide a normal voltage to the internal circuit during a normal mode of operation.

4. The device of claim 3, wherein the at least one of the first and second chips further comprises:
a first switching circuit electrically coupled to the high-voltage generator, the first switching circuit being configured to provide the test voltage to the internal circuit responsive to the test mode signal during the test mode of operation; and
a second switching circuit electrically coupled to the voltage generator, the second switching circuit being configured to provide the normal voltage to the internal circuit responsive to the test mode signal during the normal mode of operation.

5. The device of claim 4, wherein the first chip comprises a flash memory device and wherein the second chip comprises a chip designed for low voltage operation, wherein the at least one of the first and second chips comprises the flash memory device and wherein the high-voltage generator is configured to generate the test voltage such that the chip designed for low voltage operation is shielded from the test voltage.

6. The device of claim 5, wherein the test voltage comprises a voltage from about 4.5 V to about 6 V.

7. An integrated circuit device comprising:
a first chip including a memory device and a second chip including a device configured for low voltage operation; and
a common input/output pad electrically coupled to the first and second chips, the first chip comprising:
a high voltage generator configured to receive an input voltage through the common input/output pad and generate a test voltage, higher than the input voltage, responsive to a test mode signal during a test mode of operation such that the second chip is shielded from the test voltage.

8. The device of claim 7, wherein the first chip further comprises an internal circuit and wherein the high voltage generator is further configured to provide the generated test voltage to the internal circuit.

9. The device of claim 8, wherein the first chip further comprises a voltage generator configured to provide a normal voltage to the internal circuit during a normal mode of operation.

10. The device of claim 9, wherein the first chip further comprises:
a first switching circuit electrically coupled to the high-voltage generator, the first switching circuit being configured to provide the test voltage to the internal circuit responsive to the test mode signal during the test mode of operation; and a second switching circuit electrically coupled to the voltage generator, the second switching circuit being configured to provide the normal voltage to the internal circuit responsive to the test mode signal during the normal mode of operation.

11. The device of claim 10, wherein the first switching circuit comprises a PMOS or an NMOS transistor and wherein the second switching circuit comprises a PMOS or an NMOS transistor.

12. A semiconductor memory device comprising a high-voltage generator configured to receive an input voltage and to generate a test voltage, higher than the input voltage, responsive to a test mode control signal during a test mode of operation such that a low voltage device coupled to the semiconductor memory device is shielded from the test voltage.

13. The device of claim 12, further comprising:
an input/output pad electrically coupled to the high-voltage generator and the low voltage device, the input/output pad being configured to provide the input voltage to the high-voltage generator; and
an internal circuit electrically coupled to the high-voltage generator, the high-voltage generator being further configured to provide the test voltage to the internal circuit responsive to the test mode signal during a test mode of operation.

14. The device of claim 13, further comprising a voltage generator electrically coupled to the internal circuit configured to provide a normal voltage to the internal circuit responsive to the test mode signal during a normal mode of operation.

15. The device of claim 14, further comprising:
a first switching circuit electrically coupled to the high-voltage generator, the first switching circuit being configured to provide the test voltage to the internal circuit responsive to the test mode signal during a test mode of operation; and
a second switching circuit electrically coupled to the voltage generator, the second switching circuit being configured to provide the normal voltage to the internal circuit responsive to the test mode signal during a normal mode of operation.

16. A semiconductor memory device comprising:
a first input/output pad configured to receive a voltage signal;
a controller configured to generate a test mode signal indicating operation in a normal mode of operation of a test mode of operation;
a high voltage generator electrically coupled to the controller and configured to generate a test voltage, higher than the voltage signal, responsive to the voltage signal and the test mode signal;
a voltage generator configured to generate a normal voltage, less than the test voltage; and
a word line driver electrically coupled to the high-voltage generator and the voltage generator and configured to drive a word line responsive the normal voltage or the test voltage responsive to the test mode signal.

17. The device of claim 16, wherein the semiconductor memory device comprises a flash memory device.

18. The device of claim 16, wherein the test voltage comprises a voltage from about 4.5 V to about 6.0 V.

19. An integrated circuit device comprising:
first and second semiconductor chips; and
a common input/output pad electrically coupled to the first and second semiconductor chips, the first semiconductor chip including:
a controller configured to generate a test mode signal indicating operation in a normal mode of operation or a test mode of operation;
a high voltage generator electrically coupled to the controller and the input/output pad configured to receive a voltage signal from the common input/output pad and generate a test voltage, higher than the voltage signal, during the test mode of operation responsive to the voltage signal and the test mode signal;
a normal voltage generator configured to generate a normal voltage, less than the test voltage during the normal mode of operation; and
a word line supply circuit electrically coupled to the high-voltage generator and the voltage generator configured to drive the word line responsive to the normal voltage or test voltage responsive to the test mode signal.

20. The device of claim 19, wherein the word line supply circuit comprises:
a word line driver electrically coupled to the high-voltage generator and the voltage generator configured to drive the word line responsive to the normal voltage or the test voltage;
a first switch electrically coupled to the high-voltage generator configured to transmit the test voltage to the word line driver responsive to the test mode signal in the test mode of operation; and
a second switch electrically coupled to the voltage generator configured to transmit the normal voltage to the word line driver responsive to the test mode signal during the normal mode of operation.

21. The device of claim 20, wherein the first semiconductor chip comprises a flash memory chip.

22. A method of operating an integrated circuit device comprising:
receiving, at a high voltage generator included in at least one of a first or second chip, an input voltage through an input/output pad electrically coupled to the first and second chips; and
generating a test voltage, higher than the input voltage, responsive to a test mode signal during a test mode of operation.

23. The method of claim 22, further comprising providing the generated test voltage to an internal circuit of the at least one of the first and second chips.

24. The method of claim 23, providing a normal voltage to the internal circuit during a normal mode of operation.

25. The method of claim 24, wherein the first chip comprises a flash memory device and wherein the second chip comprises a chip designed for low voltage operation, wherein the at least one of the first and second chips comprises the flash memory device and wherein the method further comprises generating the test voltage such that the chip designed for low voltage operation is shielded from the test voltage.

26. A method of operating a semiconductor memory device comprising:
receiving an input voltage at a high-voltage generator of the semiconductor memory device; and
generating a test voltage, higher than the input voltage, responsive to a test mode signal during a test mode of operation such that a low voltage device coupled to the semiconductor memory device is shielded from the test voltage.

27. The method of claim 26, further comprising:
providing an input voltage to the high-voltage generator from an input/output pad electrically coupled to the high-voltage generator and the low voltage device; and
providing the test voltage to an internal circuit from the high voltage generator responsive to the test mode signal.

28. The method of claim 27, further comprising providing a normal voltage to the internal circuit responsive to the test mode signal during a normal mode of operation.

29. A method of operating a semiconductor memory device comprising:
receiving a voltage signal at an input/output pad;
generating a test mode signal indicating operation in a normal mode of operation or a test mode of operation;
generating a test voltage, higher than the voltage signal, responsive to the voltage signal and the test mode signal;
generating a normal voltage, less than the test voltage; and
driving a word line responsive the normal voltage or the test voltage responsive to the test mode signal.

30. A method of operating an integrated circuit device comprising:
generating a test mode signal indicating operation in a normal mode of operation or a test mode of operation;
receiving a voltage signal at a high-voltage generator;
generating a test voltage, higher than the voltage signal, during the test mode of operation responsive to the voltage signal and the test mode signal;
generating a normal voltage, less than the test voltage, during the normal mode of operation; and
driving the word line responsive to the normal voltage or test voltage responsive to the test mode signal.

* * * * *

UNITED STATES PATENT AND TRADEMARK OFFICE
CERTIFICATE OF CORRECTION

| | | |
|---|---|---|
| PATENT NO. | : 7,154,790 B2 | Page 1 of 1 |
| APPLICATION NO. | : 11/001343 | |
| DATED | : December 26, 2006 | |
| INVENTOR(S) | : Han et al. | |

It is certified that error appears in the above-identified patent and that said Letters Patent is hereby corrected as shown below:

On The Title Page,

Primary Examiner's Name should read: --Anh Phung--

Signed and Sealed this

Tenth Day of April, 2007

JON W. DUDAS
*Director of the United States Patent and Trademark Office*